United States Patent
Ma et al.

(10) Patent No.: US 8,779,822 B2
(45) Date of Patent: *Jul. 15, 2014

(54) POWER SUPPLY INDUCED SIGNAL JITTER COMPENSATION

(71) Applicant: Micron Technology, Inc., Boise, ID (US)

(72) Inventors: Yantao Ma, Boise, ID (US); Aaron Willey, Burlington, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/887,050

(22) Filed: May 3, 2013

(65) Prior Publication Data

US 2013/0241619 A1  Sep. 19, 2013

Related U.S. Application Data

(63) Continuation of application No. 13/006,111, filed on Jan. 13, 2011, now Pat. No. 8,436,670.

(51) Int. Cl.
   *H03H 11/26* (2006.01)
(52) U.S. Cl.
   USPC ............................ 327/276; 327/278; 327/285

(58) Field of Classification Search
   USPC .................. 327/170, 276–278, 285, 403, 404
   See application file for complete search history.

(56) References Cited

U.S. PATENT DOCUMENTS

| | | | |
|---|---|---|---|
| 5,563,543 A | 10/1996 | Martin | |
| 6,310,500 B1 | 10/2001 | Varma | |
| 6,570,812 B2 | 5/2003 | Kono | |
| 6,879,534 B2 | 4/2005 | Perner et al. | |
| 7,064,997 B2 | 6/2006 | Matsuzaki | |
| 7,667,514 B2 * | 2/2010 | Yamazaki et al. | ............ 327/276 |
| 7,692,480 B2 | 4/2010 | Gebara et al. | |
| 7,694,203 B2 | 4/2010 | Liu et al. | |
| 7,868,677 B2 | 1/2011 | Jain | |
| 7,952,405 B2 | 5/2011 | Lee | |
| 2007/0222493 A1 * | 9/2007 | Afentakis et al. | ............ 327/276 |
| 2012/0182057 A1 | 7/2012 | Ma et al. | |

* cited by examiner

*Primary Examiner* — An Luu
(74) *Attorney, Agent, or Firm* — Dorsey & Whitney LLP (57) ABSTRACT

Examples of circuits and methods for compensating for power supply induced signal jitter in path elements sensitive to power supply variation. An example includes a signal path coupling an input to an output, the signal path including a delay element having a first delay and a bias-controlled delay element having a second delay. The first delay of the delay element exhibits a first response to changes in power applied thereto and the second delay of the bias-controlled delay element exhibits a second response to changes in the power applied such that the second response compensates at least in part for the first response.

21 Claims, 7 Drawing Sheets

POWER SUPPLY INDUCED SIGNAL JITTER COMPENSATION

CROSS-REFERENCE TO RELATED APPLICATION

This application is a continuation of U.S. patent application Ser. No. 13/006,111, filed Jan. 13, 2011, and issued as U.S. Pat. No. 8,436,670 on May 7, 2013. This application and patent are incorporated by reference herein, in their entirety, for all purposes.

TECHNICAL FIELD

Embodiments of the present invention relate generally to semiconductor memory and, more specifically, in one or more illustrated embodiments, to methods and apparatuses for reducing clock jitter from power supply variation in such circuits.

BACKGROUND OF THE INVENTION

Memory devices typically include a plurality of memory cells, which may be arranged in an array of intersecting rows and columns. Read and write operations, to respectively store and retrieve memory contents, may involve multiple steps and accessing multiple memory cells at approximately the same time. One or more clocks can serve to synchronize activities in a memory device. Such clocks can be distributed throughout the memory device through its clock distribution network. Various components of a clock path, for example clock drivers and delay cells of a delay line, can be sensitive to variations in supply voltage and/or current used to power the memory device. Clock path constituents can differ in their sensitivity to supply variations.

Memory devices are commonly powered by a variety of means. In some cases, the circuits are powered solely from an external source coupled to a power supply terminal. Memory device suppliers can specify minimum and maximum supply voltage and/or current (i.e., operating parameters) for proper operation of the memory device. Even within specified operating parameters, components of a clock path may exhibit different levels of sensitivity to supply variations sufficient to cause time variation (or jitter) of the clock signal and outputs. Accordingly, it is desirable to reduce clock jitter arising from variations in supply voltage and/or current.

DETAILED DESCRIPTION OF THE INVENTION

In the following description, certain details are set forth below to provide a sufficient understanding of the invention. However, it will be clear to one skilled in the art that the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
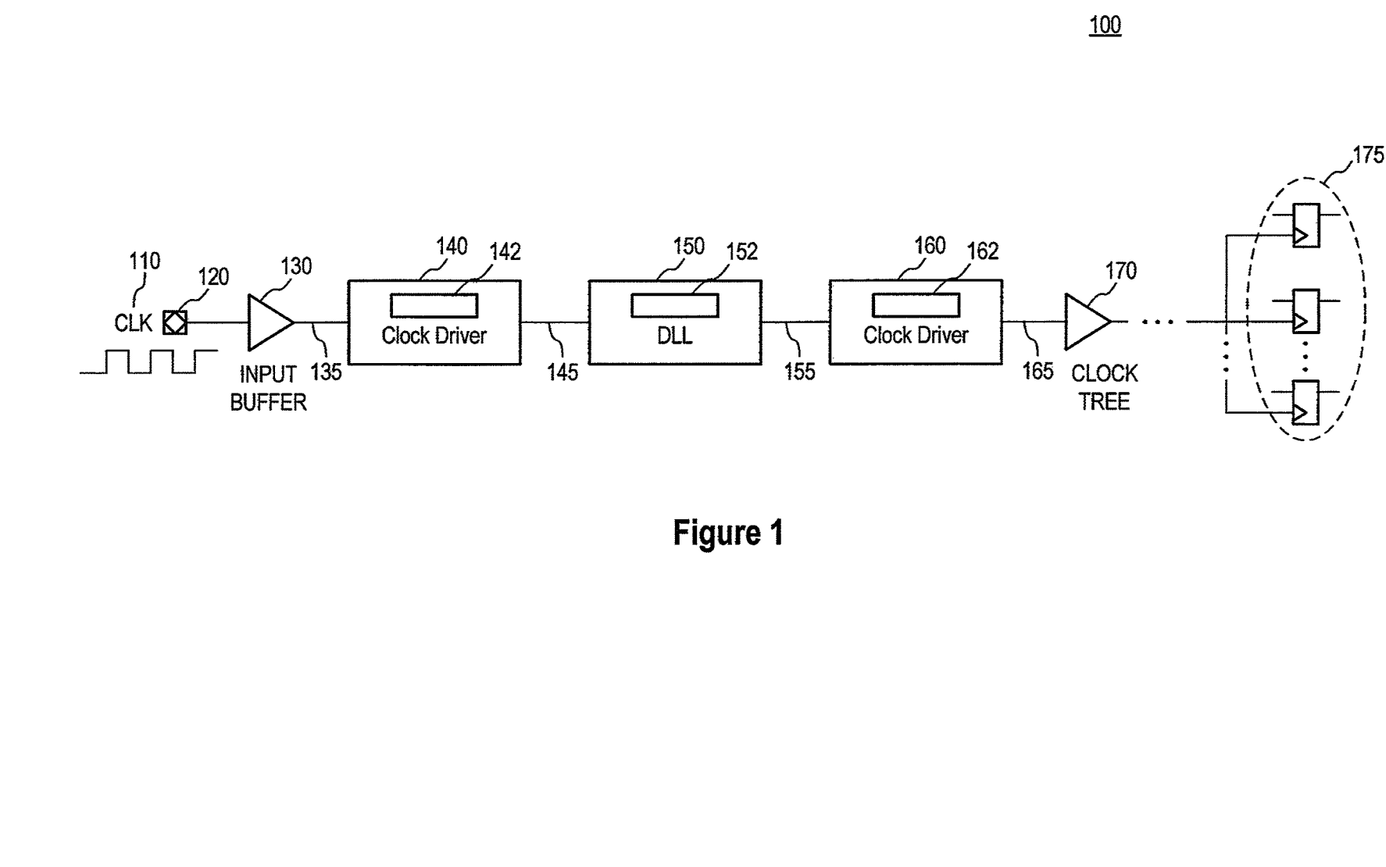
FIG. 1 is a simplified functional block diagram of a clock path with compensation for power-induced clock jitter according to an embodiment of the present invention

FIG. 1 illustrates a clock path 100 according to an embodiment of the present invention. Clock signal 110 oscillates between a high state and a low state and may be at either a fixed or variable frequency. Clock signal 110 may be in the form a square wave with a variable duty cycle. The clock signal 110 may be provided to input clock buffer 130 which provides a buffered clock signal 135 to clock driver 140. One of ordinary skill in the art will recognize that many further combinations and permutations of the present invention are possible. For example, clock signal 110 may be any digital or analog signal in which jitter may be introduced.

As will be discussed in greater detail below, the input buffer 130 and/or the clock driver 140 may include a jitter compensation circuit 142. Jitter compensation circuit 142 may compensate for power supply induced clock jitter in the input buffer 130 and/or the clock driver 140. Generally, at higher power supply levels the delay of conventional driver and delay circuits decrease, whereas at lower power supply levels the delay increases exponentially. With a wide operating voltage range, clock jitter can be introduced by variations in the power (e.g., voltage and/or current) provided by power supplies globally and/or locally. In addition, instantaneous changes in supply voltage (e.g., power ramp response from exiting power saving modes) can also introduce jitter. Jitter compensation circuit 142 may reduce power supply sensitivity by changing or modulating a delay with respect to a bias current or voltage to compensate for the general tendency of conventional circuits to decrease delay for increased power supply levels and increase delay for decreased power supply levels. Jitter compensation circuit 142 may also reduce power supply sensitivity by mixing two clock paths according to bias currents and/or voltages. Clock driver 140 outputs compensated clock signal 145.

Compensated clock signal 145 is provided to delay locked loop (DLL) 150. As readily understood by one of ordinary skill in the art, DLL 150 may include a variable delay line and control logic (not shown). The delay of the delay line may be affected by power supply variations. The delay line produces DLL clock 155, which is a delayed version of compensated clock 145. The DLL 150 may receive a feedback input (not depicted), which is a version of DLL clock 155, for example after being output by clock driver 160 or distributed through clock tree 170. DLL control logic (not shown) may sample compensated clock 145 and feedback clock in order to adjust the delay of the delay line. The DLL delay lines may include voltage controlled delays or discrete delay elements. The DLL may further include jitter compensation circuit 152 according to an embodiment of the invention to compensate for variation of the delays due to power supply sensitivity. The DLL 150 may adjust the delay between compensated clock 145 and feedback clock until the compensated clock 145 and feedback clock achieve synchronization and have a desired phase relationship, for example 180 or 360 degrees out of phase. After the desired phase of the compensated clock 145 and the feedback clock is obtained, the DLL 150 is said to have "lock." As readily understood by one of ordinary skill in the art, in addition to correcting clock skew and delay, the DLL 150 may also perform functions such as clock multiplication, clock mirroring, clock division, phase shifting, and the like.

The DLL clock 155 may be provided to clock driver 160. The clock driver 160 may include a jitter compensation circuit 162 to compensate for power supply induced clock jitter. Jitter compensation circuit 162 may reduce power supply sensitivity by changing a delay with respect to a bias current or voltage to compensate for the general tendency of the delay of the drivers to decrease delay for increased power supply levels and increase delay for decreased power supply levels. For example, the change to the delay with respect to a bias current or voltage may be the inverse to the general tendency of the delay of the drivers. Jitter compensation circuit 162 may also minimize power sensitivity by mixing two clock paths according to a bias current or voltage. The clock driver 160 outputs compensated clock signal 165.

The compensated clock 165 can be distributed to various circuitry by clock distribution network (or clock tree) 170. The clock tree 170 may distribute compensated clock 165 (or other clocks) to circuitry where synchronous elements 175 can receive compensated clock 165 (or other clocks) as an input. Synchronous elements 175 may be flip-flops, random access memories, processors, and the like.

The present invention includes various combinations and sub-combinations of the previously described functional blocks. For example, the clock path 100 may include one, some, or other combinations of jitter compensation circuits 142, 152, 162, or in some embodiments, all of the jitter compensation circuits 142, 152, 162 are used for the clock path 100.

Figure 2A:
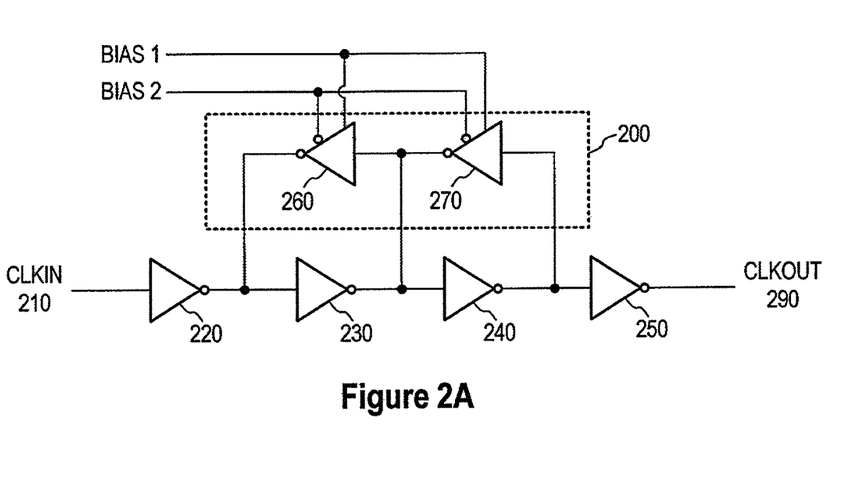
FIGS. 2A, 2B, and 2C are simplified schematic drawings of circuits for compensating for power-induced clock jitter according to various embodiments of the present invention.

A jitter compensation circuit 200 according to an embodiment of the invention is illustrated in FIG. 2A. The jitter compensation circuit 200 may be used for the jitter compensation circuits 142, 152, and 162 of FIG. 1. Input clock CLKIN 210 is provided through a series of delay elements (or buffers) 220-250 to provide output clock CLKOUT 290. The delay elements may be voltage/current controlled delays, discrete delay elements, or other delay elements. The jitter compensation circuit 200 includes bias-controlled delay elements 260, 270. The output of delay element 240 is fed back through bias-controlled delay element 270 to the input of delay element 240 and bias-controlled delay element 260. The input of bias-controlled delay element 260 is coupled to the outputs of delay elements 230 and 270. The output of bias-controlled delay element 260 can be fed back to the input of delay element 230. The CLKOUT signal 290 may be provided to the output input of jitter compensation circuit 200. The delay elements 220-250 and bias-controlled delay elements 260-270 are provided power by a power supply (not depicted). As will be described in greater detail below, the output drive strength of bias-controlled delay elements 260-270 may by adjusted based at least in part on changes to the power provided by a power supply to the jitter compensation circuit 200.

Example operation of the jitter compensation circuit 200 according to the embodiment of the invention will now be described. The delay of delay elements 220-250 may be subject to power supply sensitivity which can vary with variations in one or more power supplies providing power to the delay elements 220-250. For example, the delay of delay elements 220-250 may decrease with a higher power provided by a power supply. To compensate for this effect, the output drive strength of bias-controlled delay elements 260-270 may be increased in response to the higher power resulting in slower rise and fall times of signal transitions at the inputs of delay elements 230-240 (or the outputs of delay elements 220, 230). Effectively, the overall drive strength of delay elements 230-240 may be reduced at higher power. As a result, the increased delay may compensate for the decrease in the delay of delay elements 220-250 due to increased power provided by the power supply.

As illustrated in FIG. 2A, the bias-controlled delay elements 260-270 of the jitter compensation circuit 200 receive bias signals Bias_1 and Bias_2, which are used to adjust the output drive strength of bias-controlled delay elements 260-270. In some embodiments, the Bias_1 and Bias_2 signals are bias voltages, and in other embodiments the Bias_1 and Bias_2 signals are bias currents. As will be explained in more detail below, the Bias_11 and Bias_2 are based at least in part on the power provided by the power supply. For example, in some embodiments, the Bias_1 and Bias_2 signals increase with increasing power provided by the power supply and decrease with decreasing power provided by the power supply.

Delay through delay elements 220-250 can increase due to a decrease in the power provided by a power supply. To compensate for the increase in delay through delay elements 220-250, the output drive strength of bias-controlled delay elements 260-270 may decreased in response to the lower power resulting in faster rise and fall times of signal transitions at the inputs of delay elements 230-240 (or the outputs of delay elements 220, 230). As a result, the decreasing the drive strength of bias-controlled delay elements 260-270 may compensate for the increase in the delay of delay elements 220-250 due to decreased power from the power supply. As can be appreciated to one of ordinary skill in the art, the drive strength of bias-controlled delay elements 260-270 may not be strong enough to prevent signal transitions at the inputs of delay elements 230-240 (i.e., operate as a latch). The output of the delay element 250 is clock output 290.

Figure 2B:
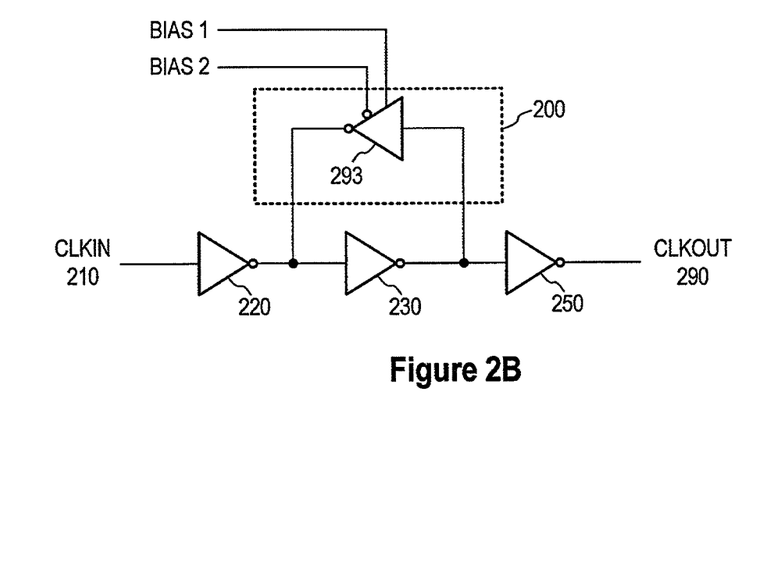
Figure 2C:
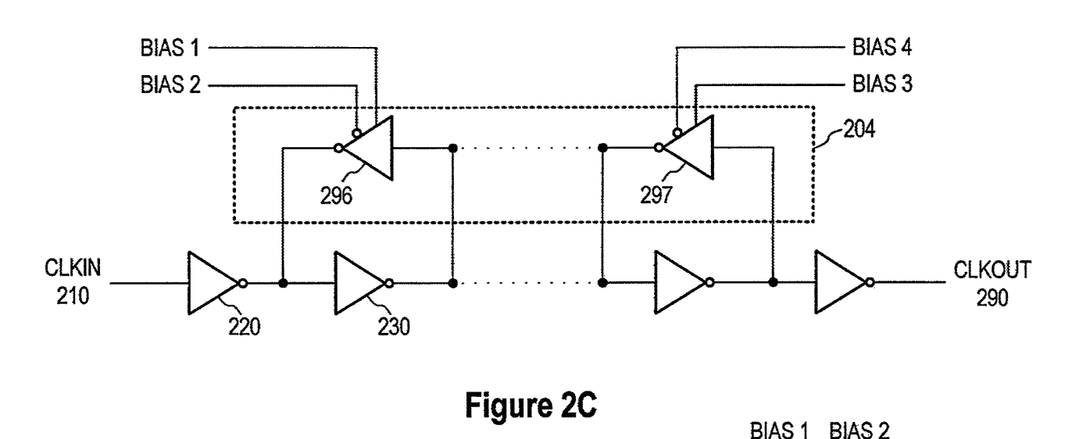

As would be readily understood to one of ordinary skill in the art, different variations and combinations of the disclosed elements are possible. In various embodiments of the present invention, there may be one or more delay elements. In addition, each of bias-controlled delay elements 260-270 can have a separate bias input. For example, FIG. 2B illustrates an embodiment of a jitter compensation circuit 202 including only one bias-controlled delay element 293 having complementary inputs Bias_1 and Bias_2. As another example, FIG. 2C illustrates an embodiment of a jitter compensation circuit 204 having two or more bias-controlled delay elements 296-297 having separate complementary inputs Bias_1, Bias_2 and Bias_3, Bias_4, respectively.

Figure 3:
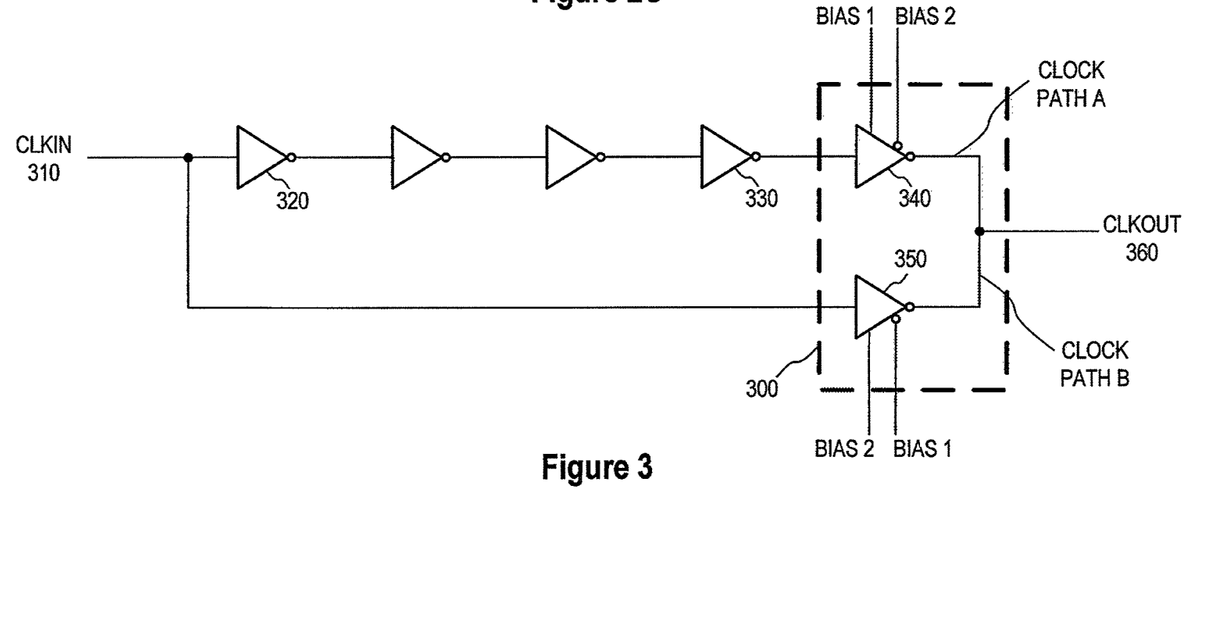
FIG. 3 is a simplified schematic drawing of circuits for compensating for power-induced clock jitter according to various embodiments of the present invention.

FIG. 3 illustrates a jitter compensation circuit 300 according to an embodiment of the invention. Jitter compensation circuit 300, which may be used as one or more of jitter compensation circuits 142, 152, and 162 of FIG. 1, is illustrated in FIG. 3. Clock input 310 can be provided through a series of delay elements 320-330, such as voltage/current controlled delays or discrete delay elements. The output signal of the last delay element in the series 330 is provided to clock output 360 of jitter compensation circuit 300 through bias-controlled delay element 340. In parallel to delay elements 320, 330 and bias-controlled delay element 340 is bias-controlled delay element 350, which receives clock input 310. The respective outputs of bias-controlled delay elements 340 and 350 are phase mixed and coupled to clock output 360. Delay elements 320-330 and bias-controlled element 340 comprise clock path A and bias-controlled delay element 350 comprises clock path B. Bias-controlled delay elements 340 and 350 are bias-controlled delay elements providing respective output signals controlled at least in part by bias inputs Bias_1 and Bias_2. As will be described in more detail below, bias inputs Bias_1 and Bias_2, which may be based at least in part on the power provided by a power supply, may be used to proportionally phase mix bias-controlled delay elements 340 and 350 to combine the respective output signals at the clock output 360. The combining of the output signals from bias-controlled delay elements 340 and 350 may be used to compensate for power supply induced clock jitter.

Example operation of the jitter compensation circuit 300 of FIG. 3 is illustrated as follows. In some embodiments, bias signals Bias_1 and Bias_2 can be used to control the drive strength of bias-controlled delay elements 340 and 350. Bias signals Bias_1 and Bias_2 may vary linearly with one or more power supplies providing power. For example, bias signals Bias_1 is higher and Bias_2 is lower at higher power from a power supply, and Bias_1 is lower and Bias_2 is higher at lower power from the power supply. The phase mixing or combining may modulate the relative portions of slower clock path A and faster clock path B at clock output 360 based at least on Bias_1 and Bias_2 levels. As a result, the drive strengths of bias-controlled delay elements 340 and 350 and the resulting combination of the respective output signals may compensate for power supply induced clock phase jitter. That is, delay through jitter compensation circuit 300 may be increased when a change in the power provided by a power supply causes a decrease in the delay of delay elements 320-330 (e.g., voltage and/or current increases). Conversely, delay through the jitter compensation circuit 300 may be decreased when a change in the power provided by the power supply causes an increase in the delay of delay elements 320-330 (e.g., voltage and/or current decreases). As a result, delays through jitter compensation circuit 300 are longer at higher power and shorter at lower power.

In an example, the Bias_1 and Bias_2 signals adjust the drive strength of bias-controlled delay element 340 to be stronger than the drive strength of bias-controlled delay element 350. In an example condition, the output drive strength of bias-controlled delay element 350 may be adjusted so that its output may be insufficient to affect clock output 360 (i.e., output of delay element 350 is weaker than delay element 340 and is a lower percentage of clock output 360). Thus, a clock signal from longer-delay clock path A combined with the signal from clock path B appears at clock output 360 to provide a delay that is increased. Likewise, delay through jitter compensation circuit 300 may be decreased when the output drive of delay element 350 is stronger than the output drive of delay element 340. For example, when bias inputs Bias_1 and Bias_2 adjust the output drive strength of delay element 340 may be insufficient to affect clock output 360 (i.e., output of delay element 340 is weaker than delay element 350 and is a lower percentage of clock output 360). Thus, a clock signal through shorter-delay clock path B combined with the signal from clock path A appears at clock output 360 to provide a delay that is decreased. The bias signals Bias_1 and Bias_2 can be varied between the two examples above to effectively phase-combine clock paths A and B. Also, bias signals Bias_1 and Bias_2 may be varied between the examples above to transition from clock path A to clock path B, and vice-versa.

As would be readily understood to one of ordinary skill in the art, different variations and combinations of the disclosed elements are possible. Bias signals Bias_1 and Bias_2 can be each be one or more digital or analog signals. In addition, the number of delay elements 320-330 may vary from that shown in FIG. 3, that is, there may be greater for fewer delay elements. For example, clock path B can have one or more delay elements, such that the delays through clock paths A and B are different. In other embodiments, there may be two or more clock paths (e.g., three clock paths).

Figure 4:
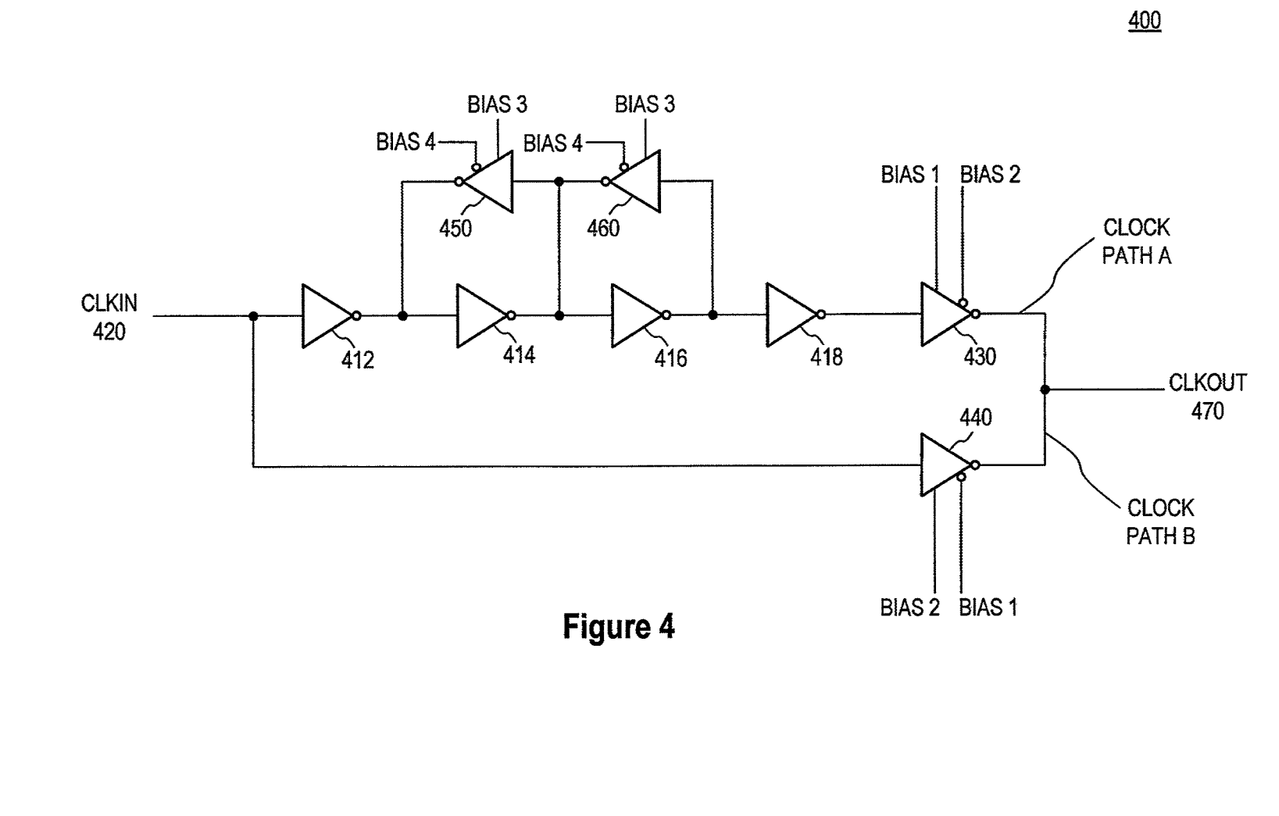
FIG. 4 is a simplified schematic drawing of a circuit for compensating for power-induced clock jitter according to an embodiment of the present invention.

FIG. 4 illustrates a jitter compensation circuit 400 according to an embodiment of the invention. The jitter compensation circuit 400 may be used as one or more of jitter compensation circuits 142, 152, and 162 of FIG. 1. Jitter compensation circuit 400 is a combination (or hybrid) of the approaches used in previously described embodiments of FIGS. 2 and 3. For example, as in the embodiment of FIG. 3, jitter compensation circuit 400 can have both clock path A and clock path B, and the signals on clock paths A and B may be modulated (or combined) to compensate for power supply induced clock jitter of delay elements 412-418. Bias signals Bias_1 and Bias_2 can control bias-controlled delay elements 430-440, such that signals provided over clock path A, clock path B, or a mix of signals of clock paths A and B, are provided at clock output 470.

Figure 5:
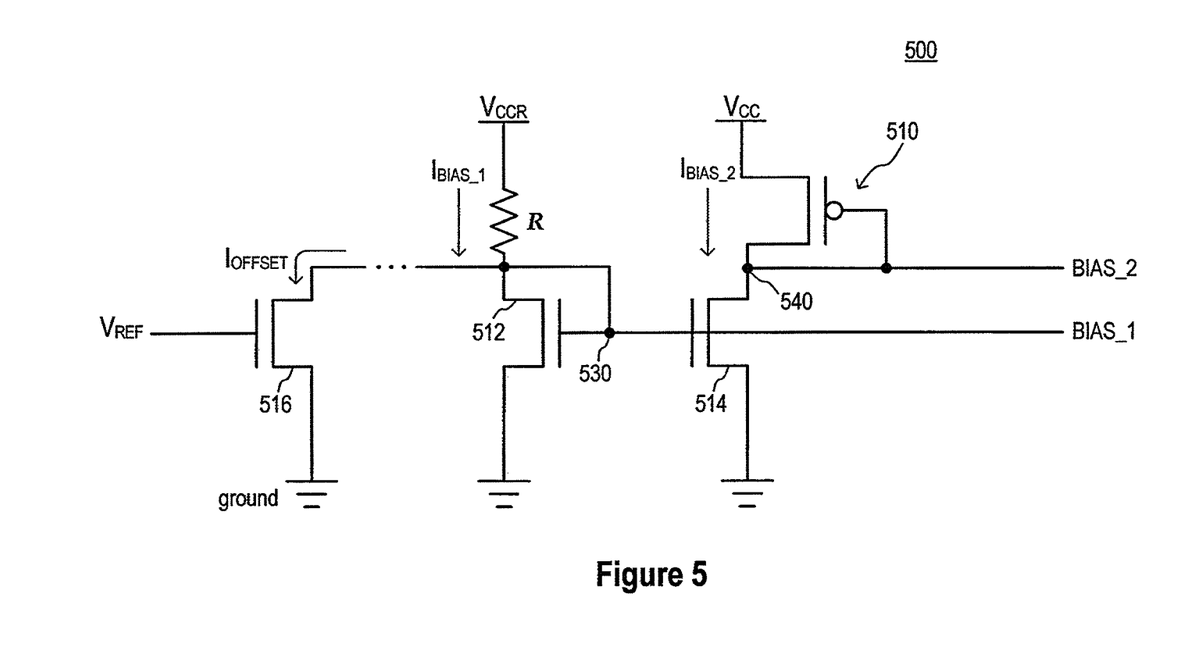
FIG. 5 is a simplified schematic diagram of a circuit for biasing the circuits of FIGS. 2-4 according to an embodiment of the present invention.

As in the embodiment of FIG. 4, clock path A can include delay elements with bias-controlled output drive. Bias signals Bias_3 and Bias_4 may control bias-controlled delay elements 450-460, such that the delay through clock path A can be adjusted in response to changes in power provided by a power supply, for example, increasing the drive strength of bias-controlled delay, elements 450 and 460 based at least in part on an increase in the power from the power supply to compensate for decreases in delays through delay elements 412-418 and decreasing the drive strength of bias-controlled delay elements 450 and 460 based at least in part on a decrease in the power from the power supply to compensate for increases in delays through delay elements 412-418. The total power-induced jitter compensation range may be determined from difference in delay between clock path A and clock path B.[02] FIG. 5 illustrates a circuit 500 to create a bias current according to various embodiments of the present invention. Circuit or circuits can generate a bias current or voltage which varies based upon a predetermined relationship (e.g., linear) with one or more power supplies. For the circuit 500, configured as a current mirror, a bias current is given by equation 1: $I_{BIAS\_1}=(VCCR-V_{Node\ 530})/R$.

The circuit 500 includes a resistance R and gate coupled transistors 512, 514. A bias current $I_{BIAS\_1}$ is mirrored in $I_{BIAS\_2}$ at a node 540 of the circuit 500. A common gate node 530 may provide a bias signal Bias_1. A supply voltage $V_{CC}$ is coupled through diode 510 to the transistor 514 and node 540 may provide a bias signal Bias_2. Bias_1 and Bias_2 signals may be used to adjust bias-controlled delay elements, for example, those included in the embodiments of the jitter compensation circuits of FIGS. 2, 3, and 4, as well as other embodiments of the invention as well. In operation, $I_{BIAS\_1}$ and $I_{BIAS\_2}$ increase as the supply voltages $V_{CCR}$ and/or $V_{CC}$ increase and $I_{BIAS\_1}$ and $I_{BIAS\_2}$ decrease as the supply voltages $V_{CCR}$ and/or $V_{CC}$ decrease.

In embodiments of the present invention, $I_{BIAS\_1}=I_{BIAS\_2}$ where transistor 512 and transistor 514 are matched in such characteristics channel length, channel width, threshold voltage, etc. In other embodiments of the present invention, $I_{BIAS\_1}=I_{BIAS\_2}*K$ where the ratio of the channel width to the channel length of transistor 514 is a multiple, K, of the ratio of the channel width to the channel length of transistor 512.

For greater flexibility and control, embodiments of the present invention may include optional transistor 516, which is coupled to node 530, $V_{REF}$, and ground. Transistor 516, having current $I_{OFFSET}$, may also be used to control bias signal Bias_2 relative to control bias signal Bias_1. $I_{BIAS\_1} = I_{BIAS\_2} - I_{OFFSET}$ where transistor 512 and transistor 514 are matched in such characteristics channel length, channel width, threshold voltage, etc. Where the ratio of channel width to channel length of transistor 514 is a multiple, K, of the ratio of channel width to channel length of transistor 512, $I_{BIAS\_2} = I_{BIAS\_1} * K - I_{OFFSET}$.

Figure 6:
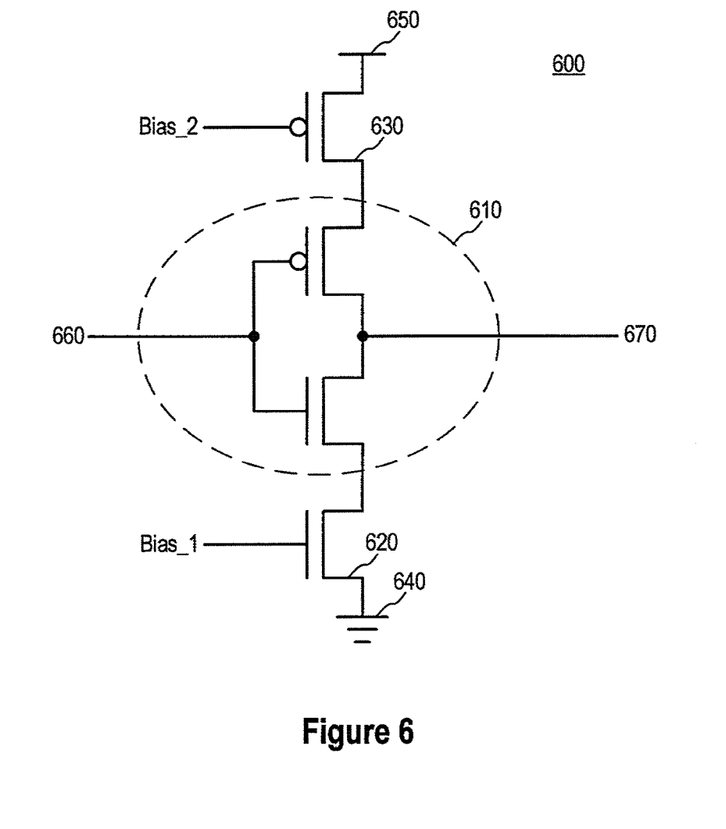
FIG. 6 is a simplified schematic diagram of a bias-controlled delay element according to an embodiment of the invention.

FIG. 6 illustrates a bias-controlled delay element 600 according to an embodiment of the invention. The bias-controlled delay element 600 may be used for the bias-controlled delay elements of the previously described embodiments, as well as other embodiments of the invention. The bias-controlled delay element includes an input 660 and an inverter 610 having complementary transistors. A transistor 620 is coupled to the inverter 610 and a ground 640 and a transistor 630 is coupled to the inverter and a power supply 650. The transistor 620 receives a bias signal Bias_1 and the transistor 630 receives a bias signal Bias_2. As previously discussed, the Bias_1 and Bias_2 signals may be based at least in part on the power provided by power supply 650 or a different power supply. The Bias_1 and Bias_2 signals may be used to control the output drive strength at output 670 of delay element 600. For example, the output drive at output 670 may be decreased by decreasing a voltage of the Bias_1 signal, increasing a voltage of the Bias_2 signal, or combinations of the two. The output drive strength of the delay element 600 may be increased by increasing the voltage of the Bias_1 signal, decreasing the voltage of the Bias_2 signal, or combinations of both.

Figure 7:
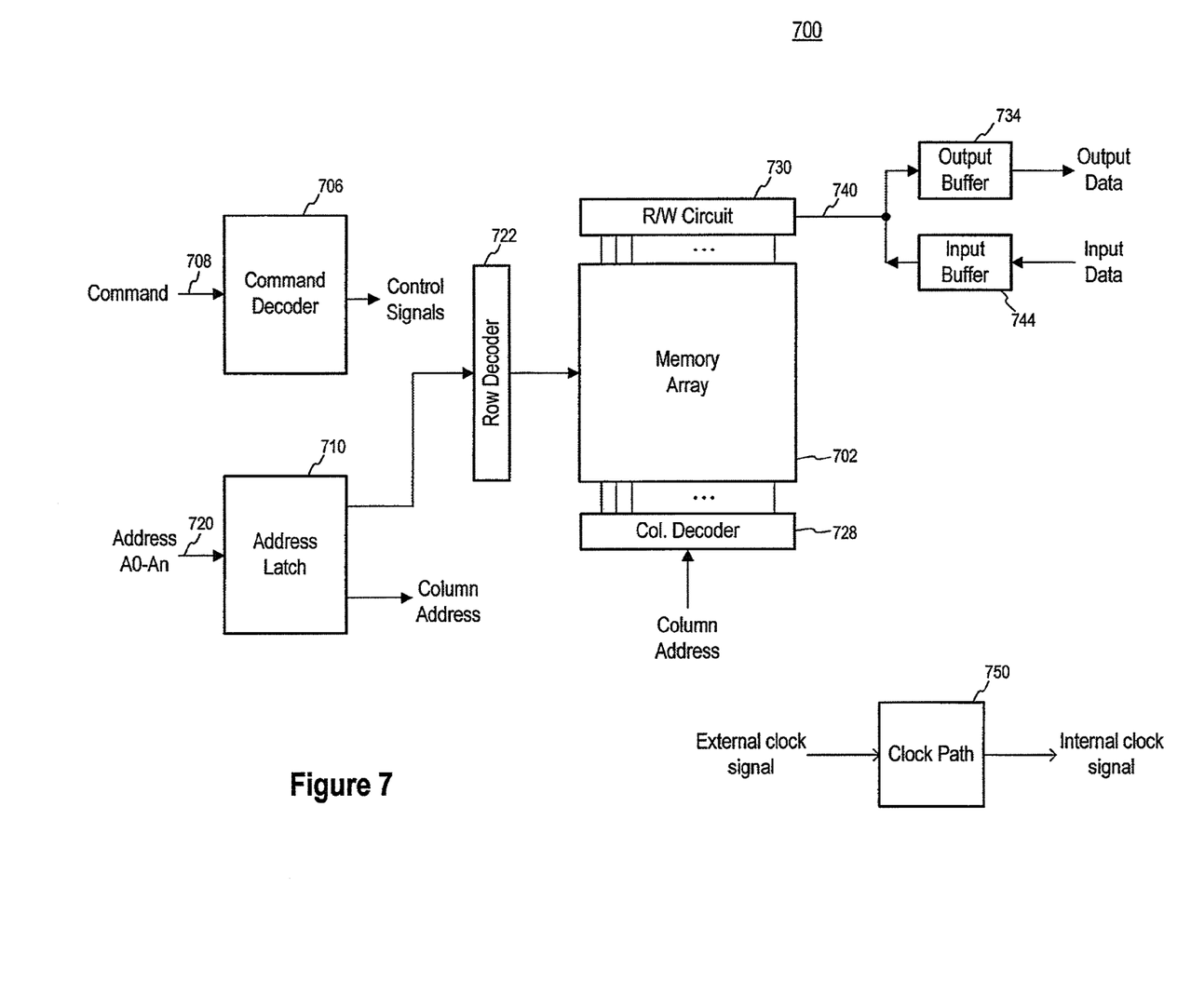
FIG. 7 is a simplified block diagram of a memory having a circuit for compensating for power-induced clock jitter according to an embodiment of the present invention.

FIG. 7 illustrates a random access memory according to certain embodiments of the present invention. The memory 700 includes an array 702 of memory cells, which may be, for example, DRAM memory cells, SRAM memory cells, flash memory cells, or some other type of memory cells. The memory system 700 includes a command decoder 706 that receives memory commands through a command bus 708 and generates corresponding control signals within the memory system 700 to carry out various memory operations. The command decoder 706 responds to memory commands applied to the command bus 708 to perform various operations on the memory array 702. For example, the command decoder 706 is used to generate internal control signals to read data from and write data to the memory array 702. Row and column address signals are applied to the memory system 700 through an address bus 720 and provided to an address latch 710. The address latch then outputs a separate column address and a separate row address.

The row and column addresses are provided by the address latch 710 to a row address decoder 722 and a column address decoder 728, respectively. The column address decoder 728 selects bit lines extending through the array 702 corresponding to respective column addresses. The row address decoder 722 is connected to word line driver 724 that activates respective rows of memory cells in the array 702 corresponding to received row addresses. The selected data line (e.g., a bit line or bit lines) corresponding to a received column address are coupled to a read/write circuitry 730 to provide read data to a data output buffer 734 via an input-output data bus 740. Write data are applied to the memory array 602 through a data input buffer 744 and the memory array read/write circuitry 730.

Clock path 750 is configured to receive an external clock signal and generate a synchronized internal clock signal and minimize power supply induced jitter in accordance with embodiments of the present invention. An embodiment of clock path 750 is represented by clock path 100 of FIG. 1. The clock signal generator 750 may supply one or more clock signals to one or more of the command decoder 706, address latch 710, read/write circuitry 730, data output buffer 744, and input buffer 744 to facilitate the latching of command, address, and data signals in accordance with the external clock.

Memory systems in accordance with embodiments of the present invention may be used in any of a variety of electronic devices including, but not limited to, computing systems, electronic storage systems, cameras, phones, wireless devices, displays, chip sets, set top boxes, or gaming systems.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
   a delay element having a delay, wherein the delay element exhibits a change in the delay of the delay element responsive to a change in power applied to the delay element; and
   a bias-controlled delay element, the bias-controlled delay element configured to exhibit an increased drive strength to increase the delay of the delay element and exhibit a decreased drive strength to decrease the delay of the delay element to compensate for the change in the delay exhibited by the delay element responsive to the change in the power applied to the delay element.

2. The apparatus of claim 1, further comprising a signal path, wherein the signal path includes the delay element and the bias-controlled delay element.

3. The apparatus of claim 1, wherein the bias-controlled delay element is configured to receive a bias signal.

4. The apparatus of claim 3, wherein changes in magnitude of the bias signal are proportionate to the changes in power applied to the delay element.

5. The apparatus of claim 3, wherein the drive strength of the bias-controlled delay element is controlled based on the magnitude of the bias signal.

6. The apparatus of claim 4, wherein the delay element is configured to receive an input signal and to provide an output signal delayed relative to the input signal.

7. An apparatus comprising:
   a delay element having a first delay, wherein the first delay of the delay element exhibits a first response to changes in applied power; and
   a bias-controlled delay element having a second delay, wherein the second delay of the bias-controlled delay element exhibits a second response to changes in the applied power, wherein the second response compensates, at least in part, for the first response.

8. The apparatus of claim 7, further comprising a signal path, wherein the signal path includes the delay element and the bias-controlled delay element, wherein the signal path is configured to phase combine a first signal and a second signal.

9. The apparatus of claim 8, wherein the first signal is delayed relative to the second signal.

10. The apparatus of claim 8, wherein the bias-controlled delay element is configured to provide the first signal at an output, and wherein the signal path further comprises a second bias-controlled delay element configured to provide the second signal at an output.

11. The apparatus of claim 10, wherein the signal path further comprises a plurality of serially coupled delay elements, wherein an output of a last of the serially coupled delay elements is coupled to an input of the bias-controlled delay element.

12. The apparatus of claim 11, further comprising:
a third bias-controlled delay element coupled in parallel to the signal line, the third bias-controlled delay element including an output coupled to a node between a first delay element of the plurality of serial delay elements and a second delay element of the plurality of serial delay elements and an input coupled to a node between the second delay element and a third delay element of the plurality of serial delay elements; and
a fourth bias-controlled delay element coupled in parallel to the signal line, the fourth bias-controlled delay element including an output coupled to the node between the second delay element and the third delay element and an input coupled to a node between the third delay element and a fourth delay element of the plurality of serial delay elements, wherein the output of the fourth bias-controlled delay element is coupled to the input of the third bias-controlled delay element.

13. The apparatus of claim 7, wherein the bias-controlled delay element is configured to receive a bias signal, wherein the second delay of the bias-controlled delay element exhibiting the second response is based on a magnitude of the bias signal.

14. A method comprising:
determining a power supply voltage; and
adjusting signal transition times of a buffer proportional to the power supply voltage by feeding back an output of a buffer to a bias-controlled delay element.

15. The method of claim 14, further comprising:
receiving a bias signal having a value based on a value of the power supply voltage; and
adjusting an output drive of the bias-controlled delay element based on the value of the bias signal.

16. The method of claim 15, wherein the value of the bias signal is proportional to the value of the power supply voltage.

17. The method of claim 15, further comprising:
providing an input signal through the buffer to produce an output signal; and
providing the output signal having the adjusted signal transition time.

18. A method comprising:
receiving a first bias signal and a second bias signal, the first bias signal and the second bias signal having a magnitude based on power provided by a power supply; and
propagating a signal through a first path and a second path, the delays of the first and second paths having different delays and wherein the first path includes a first bias-controlled delay element and the second path includes a second bias-controlled delay element.

19. The method of claim 18, further comprising combining a first output signal from the first path with a second output signal from the second path.

20. The method of claim 18, further comprising:
changing the magnitude of the first bias signal proportionately with changes to the power provided by the power supply; and
changing the magnitude of the second bias signal inversely proportionately with changes to the power provided by the power supply.

21. The method of claim 18, further comprising adjusting an output drive of each of the first bias-controlled delay element and the second bias-controlled delay element based on the magnitudes of the first bias signal and the second bias signal.

* * * * *